United States Patent [19]

Venkatesh

[11] Patent Number: 4,654,831
[45] Date of Patent: Mar. 31, 1987

[54] HIGH SPEED CMOS CURRENT SENSE AMPLIFIER

[75] Inventor: Bhimachar Venkatesh, Sunnyvale, Calif.

[73] Assignee: Advanced Micro Devices, Inc., Sunnyvale, Calif.

[21] Appl. No.: 722,251

[22] Filed: Apr. 11, 1985

[51] Int. Cl.⁴ .............................................. G11C 7/02
[52] U.S. Cl. .................................... 365/207; 365/210
[58] Field of Search ............... 365/207, 210, 208, 203, 365/205

[56] References Cited

U.S. PATENT DOCUMENTS 4,223,394 9/1980 Pathak et al. ..................... 365/210

Primary Examiner—Joseph A. Popek
Attorney, Agent, or Firm—Patrick T. King; Davis Chin; Eugene H. Valet

[57] ABSTRACT

A CMOS current sense amplifier circuit for providing a high speed of operation includes a sense amplifier, a dummy sense amplifier and an operational sense amplifier. A memory array is formed of a plurality of core transistors which are arranged in a plurality of rows of word lines and a plurality of columns of bit-lines. A dummy bit-line is formed of a plurality of core transistors which are arranged in parallel along the rows of word lines. A first pass transistor and a plurality of Y-pass transistors are coupled between the sense amplifier and the memory array. Second and third pass transistors are coupled between the dummy sense amplifier and the dummy bit-line. A plurality of N-channel MOS transistors are used to clamp all of the bit-lines in the array and dummy bit-line to a ground potential. The operational sense amplifier is responsive to the sense amplifier, dummy sense amplifier and the clamping transistors for generating an output signal which has a fast response time when making a low-to-high transition (that is when selecting an unprogrammed memory cell).

16 Claims, 2 Drawing Figures

HIGH SPEED CMOS CURRENT SENSE AMPLIFIER

BACKGROUND OF THE INVENTION

This invention relates generally to current sense amplifiers and more particularly, it relates to a high speed CMOS current sense amplifier circuit which has a fast response time when making a low-to-high (zero to one) transition.

Current sense amplifiers are generally well known in the prior art and are typically used in electronic circuits to read data out of semiconductor memories such as EPROMs and EEPROMs. However, these prior art sense amplifiers suffer from the shortcomings of having to trade a high-to-low transition with a low-to-high transition. Because of commercial demands for significant increases in access time for addressable memories fabricated on integrated circuit semiconductor chips, it has become very important to memory designers to have available a current sense amplifier circuit which operates at high speeds so as to improve efficiency of the overall memory circuit operation.

It would therefore be desirable to provide a current sense amplifier circuit whose design does not depend upon a trade-off between the high-to-low and low-to-high transitions. In the present invention, the low-to-high transition is made extremely fast by precharging all bit-lines to ground with the aid of clamping transistors, thereby requiring that all of the bit-lines charge up from the ground level. This allows the circuit designer to optimize the sense amplifier for the high-to-low transition without deteriorating the low-to-high transition. The sense amplifier circuit of the instant invention has a low-to-high transition time of approximately 6 nanosecond at the temperature of +30° C.

SUMMARY OF THE INVENTION

Accordingly, it is a general object of the present invention to provide an improved current sense amplifier circuit which has a fast response time.

It is an object of the present invention to provide a CMOS current sense amplifier circuit which has a fast response time when making a low-to-high transition.

It is another object of the present invention to provide a CMOS current sense amplifier circuit having all of the bit-lines precharged to ground so as to facilitate a very fast low-to-high transition.

In accordance with these aims and objectives, the present invention is concerned with the provision of a CMOS current sense amplifier circuit for providing a high speed of operation which includes a sense amplifier for providing a first output. A memory array formed of core transistors is arranged in n rows of word lines and m columns of bit-lines. A first pass transistor and a plurality of Y-pass transistors are coupled between the sense amplifier and the memory array. A dummy sense amplifier is used to provide a second output. A dummy bit-line formed of core transistors are arranged in parallel along the n rows of word lines. Second and third pass transistors are coupled between the dummy sense amplifier and the dummy bit-line. Clamping devices are coupled to the memory array and dummy bit-line for maintaining each column or bit-lines at a ground potential. The first pass transistor, second pass transistor and clamping devices are responsive to false and true clamping pulse signals for permitting the quick discharge of first output of the sense amplifier and the second output of the dummy sense amplifier. A differential sense amplifier is responsive to the first and second outputs for generating a third output at an output terminal which has a fast response time when making a low-to-high transition.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
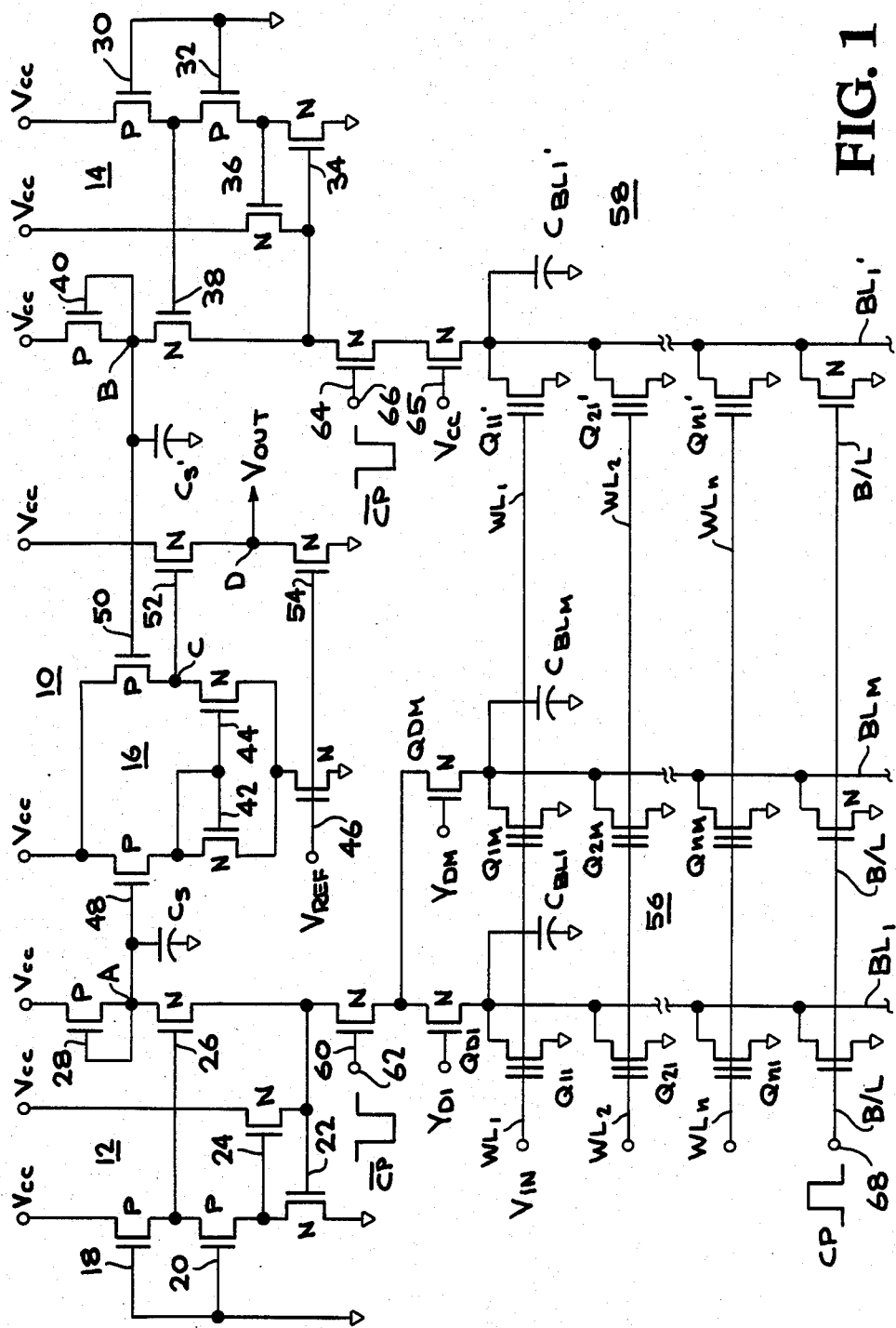
FIG. 1 is a schematic circuit diagram of a CMOS current sense amplifier circuit, according to the present invention.
Figure 2:
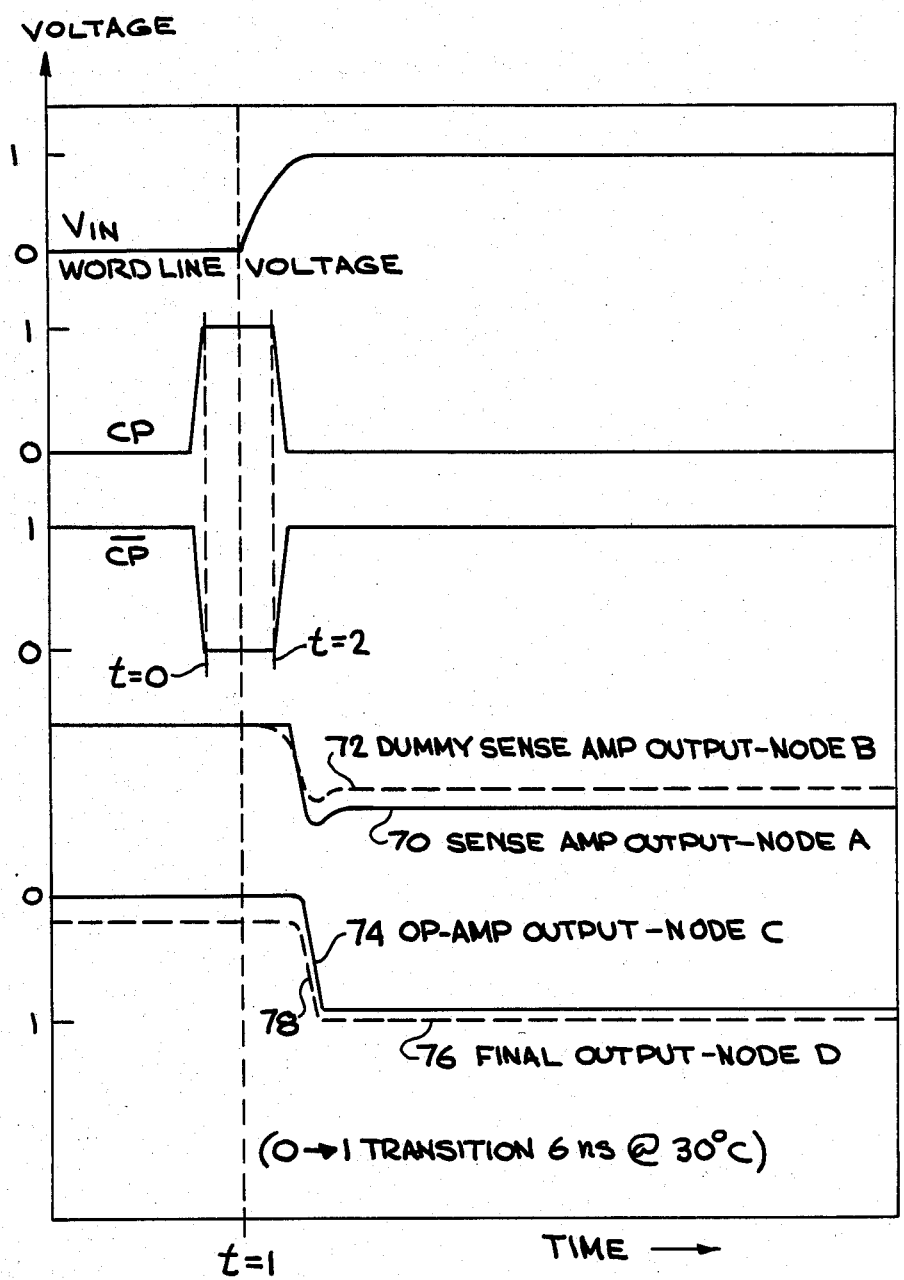
FIGS. 2(a) through 2(e) are a set of waveform diagrams useful in understanding of the operation of the sense amplifier circuit of FIG. 1.

Referring now in detail to the various views of the drawings, there is shown in FIG. 1 a schematic circuit diagram of a high speed CMOS current sense amplifier circuit 10 of the present invention. The sense amplifier circuit 10 has a very fast response time to a logic "1" state (unprogrammed EPROM cell). As a result, the sense amplifier circuit 10 makes a low-to-high (zero to one) transition almost instantaneously. The sense amplifier circuit includes a sense amplifier arrangement 12, a dummy sense amplifier arrangement 14 and an operational amplifier arrangement 16.

The sense amplifier arrangement 12 includes a pair of P-channel MOS transistors 18 and 20 having their gate electrodes connected together and to a ground potential during the read operation. The source of the transistor 18 is connected to a supply voltage of potential $V_{CC}$. The drain of the transistor 18 is connected to the source of the transistor 20. The sense amplifier arrangement 12 further includes a pair of N-channel MOS transistors 22 and 24. The transistor 22 has its drain connected to the drain of the transistor 20 and to the gate of the transistor 24. The transistor 22 has its source connected to the ground potential and its gate electrode connected to the source of the transistor 24. The drain of the transistor 24 is connected to the supply potential $V_{CC}$. The junction of the drain of the transistor 18 and the source of the transistor 20 is tied to the gate of an output transistor 26 formed of a N-channel MOS transistor. The source of the transistor 26 is connected to the source of the transistor 24. The drain of the transistor 26 is joined to the gate and drain electrodes of a load transistor 28 formed of a P-channel MOS transistor. The source of the transistor 28 is also connected to the supply potential $V_{CC}$. The junction of the common drains of the transistors 26 and 28 serves as the output (node A) of the sense amplifier arrangement 12.

The dummy sense amplifier arrangement 14 includes a pair of P-channel MOS transistors 30 and 32 having their gates connected together and to the ground potential during the read operation. The source of the transistor 30 is connected to the supply potential $V_{CC}$. The drain of the transistor 30 is connected to the source of the transistor 32. The dummy sense amplifier arrangement further includes a pair of N-channel MOS transistors 34 and 36. The transistor 34 has its drain connected to the drain of the transistor 32. The transistor 34 has its source connected to the ground potential and its gate electrode connected to the source of the transistor 36. The drain of the transistor 36 is connected to the supply potential $V_{CC}$. The junction of the drain of the transistor 30 and the source of the transistor 32 is tied to the gate of an output transistor 38 formed of a N-channel MOS transistor. The source of the transistor 38 is connected to the source of the transistor 36. The drain of the transistor 38 is joined to the gate and drain electrodes of a load transistor 40 formed of a P-channel MOS transistor. The source of the transistor 40 is also connected to the supply potential $V_{CC}$. The junction of the common drains of the transistors 38 and 40 serves as the output (node B) of the dummy sense amplifier arrangement 14.

The operational sense amplifier arrangement 16 includes current mirror N-channel MOS transistors 42 and 44 having their gate and source electrodes connected together. The common gates of the transistors 42 and 44 are connected to the drain of the transistor 42. The common sources of the transistors 42 and 44 are connected to the drain of a current source N-channel MOS transistor 46. The gate of the transistor 46 is connected to a reference voltage $V_{REF}$. The source of the transistor 46 is tied to the ground potential. A load transistor 48 formed of a P-channel MOS transistor has its source connected to the supply potential $V_{CC}$, its gate connected to the output (node A) of the sense amplifier arrangement 12, and its drain connected to the drain of the transistor 42. A load transistor 50 formed of a P-channel MOS transistor has its source also connected to the supply potential $V_{CC}$, its gate connected to the output (node B) of the dummy sense amplifier arrangement 14, and its drain connected to the drain of the transistor 44. When the operational sense amplifier arrangement 16 is considered as functioning as a differential amplifier, the junction of the drain of the transistor 50 and the drain of the transistor 44 serves as the output (node C) of the differential amplifier.

The operational sense amplifier arrangement 16 further includes an output buffer stage consisting of transistor 52 formed of a N-channel MOS transistor and a transistor 54 formed of a N-channel MOS transistor. The output (node C) of the differential amplifier is connected to the gate of the transistor 52. The transistor 52 has its drain connected to the supply potential $V_{CC}$ and its source connected to the drain of the transistor 54 and to the output $V_{OUT}$ (node D) of the sense amplifier circuit 10. The gate of the transistor 54 is connected to the reference voltage $V_{REF}$, and the source of the transistor 54 is tied to the ground potential.

The sense amplifier circuit 10 further includes a memory array 56 formed of a plurality of core transistors which are arranged in n rows of word lines $WL_1$, $WL_2$ ... through $WL_n$ by m columns of bit-lines $BL_1$, $BL_2$ ... through $BL_m$. As can be seen, each of the core transistors $Q_{11}$ ... $Q_{1m}$ in the first row (n=1) have their gate electrodes connected together and to an input data signal $V_{in}$ which is applied to the word line WL 1. All of the sources of the transistors $Q_{11}$ ... $Q_{1m}$ are connected to the ground potential. The respective drains of the core transistors $Q_{11}$ ... $Q_{1m}$ are connected to corresponding bit-lines $BL_1$ ... through $BL_m$. Similarly, each of the core transistors $Q_{21}$ ... $Q_{2m}$ to $Q_{n1}$ ... through $Q_{nm}$ in all of the remaining rows are likewise connected.

The sense amplifier circuit 10 also includes a dummy bit-line 58 formed of a plurality of core transistors. Specifically, the core transistors are arranged in parallel along the n rows of word lines $WL_1$, $WL_2$ ... through $WL_n$. In particular, each of the transistors $Q_{11'}$ ... through $Q_{n1'}$ has its respective gate connected to the input data signal $V_{in}$ which is applied to the respective word lines $WL_1$, $WL_2$ ... through $WL_n$. All of the sources of the core transistors $Q_{11'}$ ... through $Q_{n1'}$ are connected to the ground potential. The respective drains of the transistors $Q_{11'}$ ... through $Q_{n1'}$ are connected to bit-line $BL_{1'}$.

A first pass transistor 60 has its drain connected to the source of the transistor 26 of the sense amplifier arrangement 12, its source connected to all of the drains of Y-pass transistors $Q_{D1}$ ... through $Q_{Dm}$, and its gate connected to a control terminal 62. A false clamp signal $\overline{CP}$ is applied to the control terminal 62 from a clamp pulse generator (not shown). A second pass transistor 64 has its drain connected to the source of the transistor 38 of the dummy sense amplifier arrangement 14, its source connected to drain of a third base transistor 65 and its gate electrode connected to a control terminal 66. The false clamp pulse signal $\overline{CP}$ is also applied to the control terminal 66. A plurality of bit-line clamp transistors B/L are provided so that all of their sources are connected to the ground potential. All of the gates of the clamp transistors B/L are connected together and to a control terminal 68. A true clamp pulse signal CP is applied to the terminal 68 from the clamp pulse generator. Each of the drains of the transistors B/L are connected to respective bit-lines $BL_1$ ... through $BL_m$ and $BL_{1'}$ of the respective memory array 56 and dummy bit-line 58.

As previously stated, all of the Y-pass transistors $Q_{D1}$ ... through $Q_{Dm}$ have their drains connected together and to the source of the first pass transistor 60. The respective sources of the transistors $Q_{D1}$ ... through $Q_{Dm}$ are connected to corresponding bit-lines $BL_1$ ... through $BL_m$. Each of the gates of the transistor $Q_{D1}$ ... through $Q_{Dm}$ are connected to respective Y-decode signals $Y_{D1}$ ... through $Y_{Dm}$ from a Y-decoder (not shown). The Y-decode signals are used to select an unprogrammed memory cell. The third pass transistor 65 has its drain connected to the source of the second pass transistor 64, its source connected the dummy bit-line $BL_{1'}$, and its gate connected to the supply potential $V_{CC}$.

Parasitic capacitance represented by a capacitor $C_S$ has one of its ends connected to the output (node A) of the sense amplifier arrangement 12 and its other end connected to the ground potential. Parasitic capacitance represented by a capacitor $C_{BL1}$ has one of its ends connected to the common drains of the core transistors which are connected to the bit-line $BL_1$. The other end of the capacitor $C_{BL1}$ is connected to the ground potential. The capacitor $C_{BL1}$ is used to facilitate the fast response of the sense amplifier circuit by clamping all of the bit-lines to the ground potential. Thus, this ensures that all of the bit-lines are required to be charged up from the ground potential. Also, this facilitates the quick discharge of the capacitance $C_S$ at the output of the sense amplifier arrangement during a low-to-high transition of the sense amplifier circuit 10.

Reference is now made to the waveform diagrams shown in FIGS. 2(a) through 2(e) which are useful in understanding of the operation of the sense amplifier circuit 10 of FIG. 1. For ease of explanation, it will be assumed that it is desired to select the bit-line $BL_1$ wherein the gate of the Y-pass transistor $Q_{D1}$ receives the decode signal $Y_{D1}$ being in the logic "1" state. As a result, the Y-pass transistor $Q_{D1}$ will be turned on. Further, since the gate of the third transistor 65 is tied to the supply potential $V_{CC}$, it will always be turned on. Initially, at time t=0, all of the bit-line clamp transistors B/L in the array 56 and dummy bit-line 58 have a true bit-line clamp pulse signal CP at a logic "1" level (FIG. 2b) applied to their gates via the control terminal 68 so as to cause them to be turned on. This results in the clamping of all of the bit-lines $BL_1$ ... through $BL_m$ and $BL_{1'}$ to the ground potential. In other words, the capacitor $C_{BL1}$ connected to the bit-line $BL_1$ will be completely discharged and will be required to charge up from the ground potential. Simultaneously, a false bit-line clamp pulse signal $\overline{CP}$ at a logic "0" level (FIG. 2c) will be applied to the gates of the pass transistors 60 and 64 via respective control terminals 62 and 66 so as to cause them to be turned off. Thus, the capacitor $C_S$ connected to the output of the sense amplifier arrangement 12 will be fully charged up. The outputs of the sense amplifier arrangement 12 at node A and the dummy sense amplifier arrangement 14 at node B are shown in curves 70 and 72 in FIG. 2(c) respectively. The outputs of the differential amplifier at node C and the sense amplifier circuit 10 at node D are illustrated in curves 74 and 76 in FIG. 2(e) respectively.

Assuming that at time t=1 the input data signal $V_{in}$ makes a transistion from low-to-high (zero to one), the true clamp pulse signal CP will make a high-to-low transition, and the false clamp signal $\overline{CP}$ will make a low-to-high transition at a time t=2. As a result, the bit-line transistor B/L connected to the first bit-line $BL_1$ will be turned off causing the capacitor $C_{BL1}$ to start charging from the ground potential. Further, the pass transistors 60 and 64 will be turned on, permitting the outputs of the sense amplifier arrangement and dummy sense amplifier sense arrangement to discharge quickly. As a consequence, the output at node D of the sense amplifier circuit 10 responds substantially instantaneously causing the very fast low-to-high transition to appear as indicated by edge 78 in FIG. 2(e).

The sense amplifier circuit of the present invention has the following advantages over the conventional prior art sense amplifiers:

(a) it uses a plurality of bit-line clamp transistors for grounding all of the bit-lines;
(b) it provides a very fast response time when making a low-to-high transition;
(c) it has a fast response due to the quick discharging of the capacitance $C_S$ connected to the output of a sense amplifier arrangement; and
(d) the fast response during the low-to-high transition does not adversely affect the high-to-low transition.

From the foregoing detailed description, it can thus be seen that the present invention provides an improved CMOS current sense amplifier circuit which has a fast response time when making a low-to-high transition. The current sense amplifier utilizes a plurality of bit-lines clamp transistors for grounding all of the bit-lines so as to require the bit-lines to charge up from the ground level.

While there has been illustrated and described what is at present to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out this invention, but that the invention will include all embodiments falling within the scope of the appended claims.

What is claimed is:

1. A CMOS current sense amplifier circuit for providing a high speed of operation comprising:
    sense amplifier means for providing a first output;
    a memory array formed of a plurality of core transistors which are arranged in n rows of word lines and m columns of bit-lines;
    a first pass transistor and a plurality of Y-pass transistors coupled between the first output of said sense amplifier means and said memory array;
    said first pass transistor having its drain coupled to the first output of said sense amplifier means and its gate connected to a first control terminal for receiving a false clamp pulse signal;
    said plurality of Y-pass transistors having each of their drains connected together and to the source of said first pass transistor, the sources of said plurality of Y-pass transistors being connected to a corresponding one of the m columns of bit-lines;
    dummy sense amplifier means for providing a second output;
    a dummy bit-line formed of a plurality of core transistors which are arranged in parallel along the n rows of word lines;
    second and third pass transistors coupled between the second output of said dummy sense amplifier means and said dummy bit-line;
    said second pass transistor having its drain coupled to the second output of said dummy sense amplifier means and its gate connected to a second control terminal for receiving the false clamp pulse signal;
    said third pass transistor having its drain connected to the source of said second pass transistor, its gate connected to a supply potential, and its source connected to the dummy bit-line;
    clamping means coupled to said memory array and dummy bit-line for maintaining all of the bit-lines at a ground potential;
    said first pass transistor, second pass transistor and clamping means being responsive to the false and a true clamp pulse signals for permitting the quick discharging of the first output of said sense amplifier means and of the second output of said dummy sense amplifier means; and
    operational sense amplifier means responsive to said first and second outputs for generating a third output at an output terminal which has a fast response time when making a low-to-high transition.

2. A current sense amplifier circuit as claimed in claim 1, wherein said sense amplifier means comprises a pair of P-channel MOS transistors, a pair of N-channel MOS transistors, a first output transistor and a load transistor.

3. A current sense amplifier as claimed in claim 2, wherein said dummy sense amplifier means comprises a pair of P-channel MOS transistors, a pair of N-channel MOS transistors, a second output transistor, and a load transistor.

4. A current sense amplifier circuit as claimed in claim 3, wherein said clamping means comprises a plurality of N-channel MOS transistors, each transistor having its drain connected to a separate bit-line of the m columns in said memory array and to the dummy bit-line, its source connected to the ground potential and its gate connected to a control terminal for receiving the true clamp pulse signal.

5. A current sense amplifier as claimed in claim 4, wherein said operational sense amplifier means comprises a pair of current mirror transistors and a pair of load transistors, a current source, and an output buffer stage.

6. A current sense amplifier circuit as claimed in claim 2, further comprising a first capacitor coupled to the first output of said sense amplifier means which is quicky discharged so as to facilitate the fast low-to-high transition at the third output of said operational sense amplifier means.

7. A current sense amplifier circuit as claimed in claim 6, further comprising a second capacitor coupled to said clamping means which is quicky charged up from the ground potential so as to facilitate the fast low-to-high transition at the third output of said operational sense amplifier means.

8. A high speed CMOS current sense amplifier circuit comprising:
   means for generating a sense amplifier output;
   means for generating a dummy sense amplifier output;
   means responsive to said sense amplifier output and dummy sense amplifier output for generating a differential sense amplifier output;
   array means formed of a plurality of core transistors which are arranged in a plurality of rows and columns, each column of said core transistors being connected to bit-lines, said array means being operatively connected to said amplifier sense output and said dummy sense amplifier output;
   clamping means connected to all of the bit-lines of said array means for clamping said bit-lines to a ground potential so that all bit-lines are required to charge up from the ground level;
   said clamping means including a plurality of N-channel MOS transistors, each transistor having its drain connected to one bit-line of the plurality of columns in said array means, its source connected to the ground potential and its gate connected to a control terminal for receiving a true clamp pulse signal; and
   output means coupled to said differential sense amplifier output and being responsive to said clamping means for generating an output signal which has a fast low-to-high transition time.

9. A current sense amplifier circuit as claimed in claim 8, wherein said means for generating the sense amplifier output comprises a pair of P-channel MOS transistors, a pair of N-channel MOS transistors, a load transistor, and a first output transistor.

10. A current sense amplifier circuit as claimed in claim 8, wherein said means for generating the dummy sense amplifier output comprises a pair of P-channel MOS transistors, a pair of N-channel MOS transistors, a load transistor, and a second output transistor.

11. A current sense amplifier circuit as claimed in claim 8, wherein said differential sense amplifier means comprises a pair of current mirror transistors, a pair of load transistors and a current source.

12. A current sense amplifier circuit as claimed in claim 8, further comprising a capacitor coupled to the sense amplifier output which is quickly discharged so as to facilitate the fast low-to-high transition of the output signal.

13. A current sense amplifier circuit as claimed in claim 12, further comprising a second capacitor coupled to the clamping means which is quickly charged up from the ground potential so as to facilitate the fast low-to-high transition of the output signal.

14. A high speed CMOS current sense amplifier circuit comprising:
   differential sense amplifier means for generating an output signal;
   array means formed of a plurality of core transistors which are arranged in a plurality of rows and columns, each column of said core transistors being connected to bit-lines;
   means for connecting said array means to said differential sense amplifier means;
   clamping means connected to all of the bit-lines in said array means for clamping said bit-lines to a ground potential so that all bit-lines are required to charge up from the ground level;
   said clamping means including a plurality of N-channel MOS transistors, each transistor having its drain connected to one bit-line of the plurality of columns in said array means, its source connected to the ground potential and its gate connected to a control terminal for receiving a true clamp pulse signal; and
   said differential sense amplifier means being responsive to said clamping means so that the output signal has a fast low to high transition time.

15. A current sense amplifier circuit as claimed in claim 14, wherein said differential sense amplifier means comprises a pair of current mirror transistors, a pair of load transistors and a current source.

16. A current sense amplifier circuit as claimed in claim 14, wherein said connecting means includes first, second and third pass transistors and a plurality of Y-pass transistors.

* * * * *